United States Patent
Ghaemmaghami et al.

(10) Patent No.: US 7,192,836 B1
(45) Date of Patent: Mar. 20, 2007

(54) METHOD AND SYSTEM FOR PROVIDING HALO IMPLANT TO A SEMICONDUCTOR DEVICE WITH MINIMAL IMPACT TO THE JUNCTION CAPACITANCE

(75) Inventors: Ahmad Ghaemmaghami, Gilroy, CA (US); Zoran Krivokapic, Santa Clara, CA (US); Brian Swanson, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/497,320

(22) Filed: Feb. 3, 2000

Related U.S. Application Data

(60) Provisional application No. 60/168,155, filed on Nov. 29, 1999.

(51) Int. Cl.
*H01L 21/336* (2006.01)
(52) U.S. Cl. .................. 438/291; 438/302; 438/305; 438/306
(58) Field of Classification Search ........ 438/301–307, 438/514, 519, 525–527, 529, 546–549, 551–552, 438/555, 914, 942, 289–291, 217, 506, 508; 257/335, 355, 345, 402, 408, 409
See application file for complete search history.

(56) References Cited

U.S. PATENT DOCUMENTS

| | | | |
|---|---|---|---|
| 5,045,486 A * | 9/1991 | Chittipeddi et al. ........ | 438/231 |
| 5,320,974 A * | 6/1994 | Hori et al. ................. | 438/302 |
| 5,595,919 A * | 1/1997 | Pan ........................... | 438/302 |
| 5,639,687 A | 6/1997 | Roman et al. ............. | 438/69 |
| 5,675,166 A * | 10/1997 | Ilderem et al. ............ | 257/345 |
| 5,731,612 A * | 3/1998 | Buxo et al. ................ | 257/345 |

(Continued)

FOREIGN PATENT DOCUMENTS

| | | |
|---|---|---|
| EP | 0899793 | 3/1999 |

(Continued)

OTHER PUBLICATIONS

Wolf et al., "Silicon Processing for the VLSI Era, vol. 1-Process Technology", Lattice Press, 1986, pp. 321-324.*

(Continued)

*Primary Examiner*—Kenneth Parker
*Assistant Examiner*—José R. Díaz
(74) *Attorney, Agent, or Firm*—Winstead Sechrest & Minick P.C.

(57) ABSTRACT

A method and system for providing a halo implant to a semiconductor device is disclosed. The method and system includes providing a thin photoresist layer that covers a substantial amount of an active area including a source region and a drain region of the semiconductor device. The method and system further includes providing the halo implant to the semiconductor device, using the thin photoresist layer as a mask.

Utilizing this thin photoresist layer, taking into account other height variables, the source and drain regions can be opened only as needed. At a 45° angle, the implant can be delivered to all transistors in the circuit in the targeted area as well as getting only a large amount of the dose (up to ¾ of the dose) to the transistor edge which sits on the trench edge.

3 Claims, 4 Drawing Sheets

U.S. PATENT DOCUMENTS

| | | | | |
|---|---|---|---|---|
| 5,837,587 | A | | 11/1998 | Wei .............................. 438/305 |
| 5,899,719 | A | | 5/1999 | Hong .......................... 438/289 |
| 5,970,353 | A | * | 10/1999 | Sultan ......................... 438/232 |
| 5,976,937 | A | * | 11/1999 | Rodder et al. ............... 438/275 |
| 6,008,094 | A | * | 12/1999 | Krivokapic et al. ......... 438/286 |
| 6,020,244 | A | * | 2/2000 | Thompson et al. .......... 438/302 |
| 6,037,107 | A | * | 3/2000 | Thackeray et al. .......... 430/326 |
| 6,051,458 | A | * | 4/2000 | Liang et al. ................. 438/224 |
| 6,083,794 | A | * | 7/2000 | Hook et al. .................. 438/286 |
| 6,114,211 | A | * | 9/2000 | Fulford et al. ............... 438/305 |
| 6,171,913 | B1 | * | 1/2001 | Wang et al. ................. 438/289 |
| 6,320,236 | B1 | * | 11/2001 | Krivokapic et al. ......... 257/402 |

FOREIGN PATENT DOCUMENTS

JP  62163374  7/1987

OTHER PUBLICATIONS

NN9305233: "Self-Aligned Pocket Implantation Technology for Forming a Halo Type Device Using Selective Tungsten deposition." IBM Technical Disclosure Bulleting, May 1993, vol. 36, No. 5, p. 233-236.*

* cited by examiner

METHOD AND SYSTEM FOR PROVIDING HALO IMPLANT TO A SEMICONDUCTOR DEVICE WITH MINIMAL IMPACT TO THE JUNCTION CAPACITANCE

CROSS-REFERENCE TO RELATED APPLICATION

This application is related to commonly owned copending Provisional Application Ser. No. 60/168,155, filed Nov. 29, 1999, and claims the benefit of its earlier filing date under 35 U.S.C. §119(e).

FIELD OF THE INVENTION

The present invention relates to semiconductor devices and more particularly providing a halo implant when manufacturing semiconductor devices.

BACKGROUND OF THE INVENTION

A halo implant is typically utilized to implant dopant on a semiconductor device. In-line lithography or DUV (deep ultra violet) photoresist is typically utilized to mask the halo implant process. Typically, the same mask (lightly doped drain) (LDD) is utilized for the halo implant, since the halo implant takes place after the LDD implant. Due to the chemistry of the photoresist, an implant shadowing problem oftentimes occurs utilizing conventional processes (mask & photoresist set), which adversely affects yield and performance of the devices as manufacturing processes move toward smaller geometries.

The first problem is that the photoresist thickness in the area of implant is of a thickness such that an implant delivered at a 45° angle can result in an asymmetric and leaky transistor. A second problem is the thickness of the photoresist related to the trench oxidation region of the device. Accordingly, if a thick photoresist (0.55 µm or greater) is placed over the trench oxidation, due to the soft jelly type nature of the photoresist oftentimes the photoresist will fall and cover areas that are to be implanted. Even if the photoresist stands erect at the smaller process technologies, the halo implant will not reach the targeted areas. In addition, the conventional processes do not typically account for the need for selective doping of the source/drain area.

Accordingly, what is needed is a system and method for overcoming the above-identified problems at smaller process geometrics. The present invention addresses such a need.

SUMMARY OF THE INVENTION

A method and system for providing a halo implant to a semiconductor device is disclosed. The method and system comprises providing a thin photoresist layer to the semiconductor device. The method and system further includes providing the halo implant to the appropriate area of the semiconductor device.

Accordingly, in a system and method in accordance with the present invention, a photo photoresist that is capable of thinner profile, i.e., DUV photoresist, is utilized. This will allow one to lower the photoresist thickness to the proposed 1000 A (in the field) or lower if the process allows. With this photoresist thickness, taking into account other height variables, the source and drain regions can be opened only as needed.

At a 45° angle, the implant can be delivered to all transistors in the circuit in the targeted area as well as getting only a large amount of the dose (up to ¾ of the dose) to the transistor edge which sits on the trench edge. This will also minimize the counter doping of the source drain with the opposite species as is required by the definition of the halo process.

In the smaller geometries of 0.18 um technologies and lower, the gate height will actually work to advantage and help reduce unwanted counter doping of the source/drain area. In this way the counter doping can be maintained to an absolute minimum. The final advantage is that with the thinner photoresist, we will enhance our ability to provide the implant to smaller geometries. Accordingly, the process in accordance with the present invention is the improvement in the manufacture-ability as well as enhancing the process capability and device performance and speed.

DETAILED DESCRIPTION

The present invention relates to semiconductor devices and more particularly providing a halo implant when manufacturing semiconductor devices. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
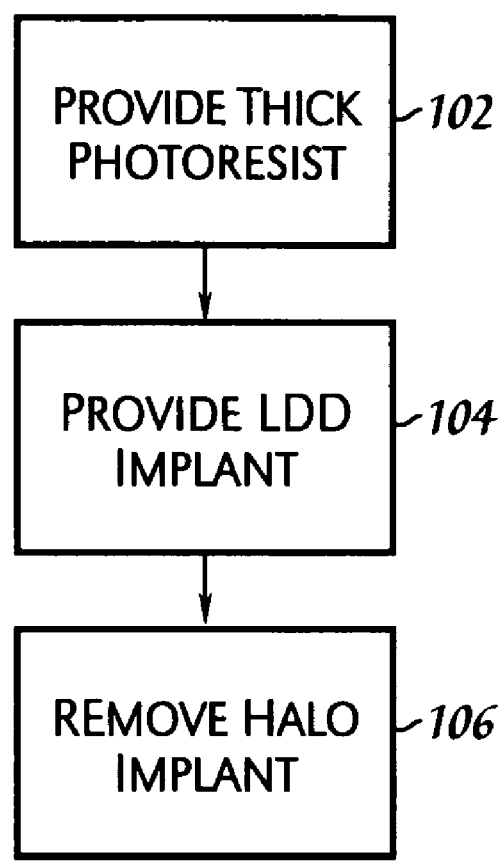
FIG. 1 is a flow chart illustrating a conventional process for providing a halo implant.

FIG. 1 is a flow chart illustrating a conventional process for providing a halo implant. Typically in the conventional process, first a thick photoresist is provided, via step 102. Then, an LDD implant is provided, via step 104. The thick photoresist or LDD mask in a conventional process is typically a photoresist that is 0.55 µm in height. After the LDD implant is provided, then we provide what is referred to as the halo implant, via step 106. The halo implant typically is provided at a 45° angle to implant underneath the gate area. For a wafer at a 45° implant, to consistently implant the intended area, a LDD mask is utilized which does not cover the source or drain regions.

Figure 2:
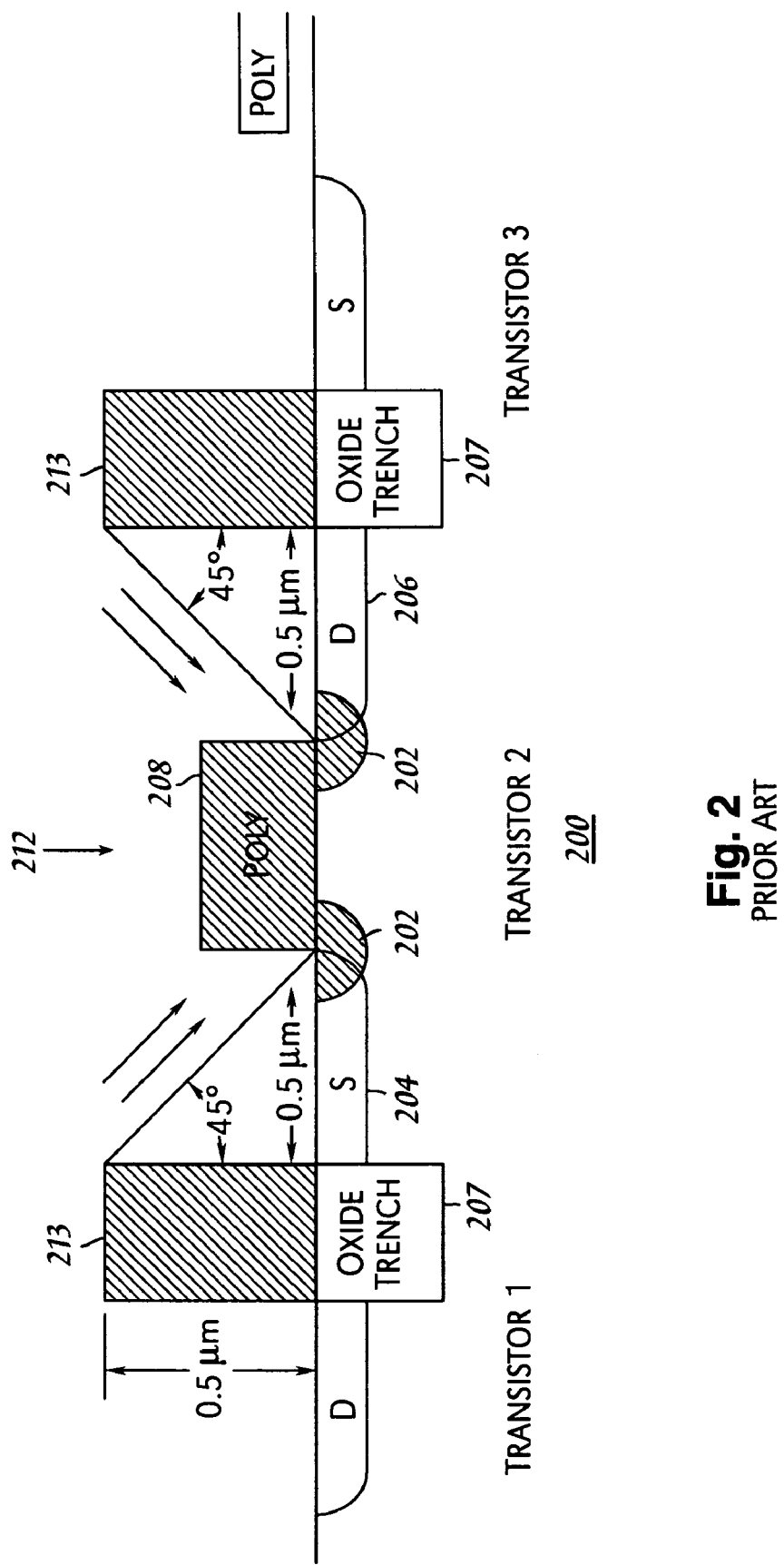
FIG. 2 is a diagram illustrating the semiconductor device after a conventional halo implant.

FIG. 2 is a diagram illustrating the semiconductor device 200 after a conventional halo implant. Accordingly oftentimes the halo implant 202 ends up providing a dopant to all of the source region 204 and drain region 206. Since only the area directly underneath the gate 208 is the area of interest for the implant, there is leakage and other problems associated therewith. Accordingly, the entire active area 212 is open primarily because the thickness of the photoresist mask 213 is such that at a 45° angle, the ultraviolet rays cannot accurately be provided underneath the gate area.

As is seen, with a photoresist mask 213 thickness of 0.5 µm, the 45° angle will require that a large portion of the ultraviolet radiation will not reach the area of interest because at that angle, with the thick photoresist, it is not possible. In addition, if a thick photoresist of (0.5 µm or greater) is placed over the trench oxidation 207, due to the soft jelly type nature of the photoresist, oftentimes the photoresist will fall over in the trench oxidation area and cover areas that are to be implanted. Even if the photoresist stands erect at the smaller process technologies, the halo implant will not reach the targeted areas.

In a system and method in accordance with the present invention, the implant area is selectively targeted instead of performing a blanket implant. This is accomplished by using a thinner photoresist mask thickness of between 0.1 µm to 0.2 µm instead of 0.55 µm to 0.8 µm photoresist utilized in the conventional process. To more particularly describe the features of the present invention, refer now to the following discussion in conjunction with the figures.

Figure 3:
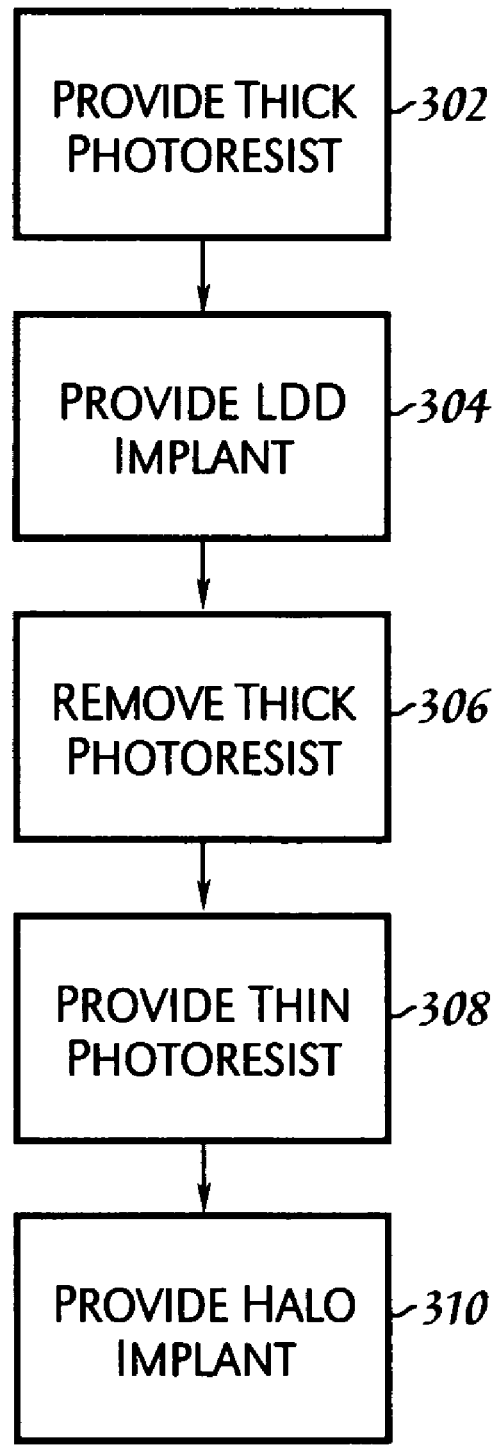
FIG. 3 is a flow chart of a system in accordance with the present invention.

FIG. 3 is a flow chart of a system in accordance with the present invention. Typically as in the conventional process, first a thick photoresist is provided, via step 302. Then, an LDD implant is provided, via step 304. Next, the thick photoresist is removed, via step 306. Thereafter, a thin photoresist is provided, via step 308. Thereafter, a halo implant is provided, via step 310. The halo implant typically is provided at a 45° angle to implant underneath the gate area. For a wafer at a 45° halo implant, to consistently implant the intended area, a LDD mask is utilized which does cover a substantial portion of the source or drain regions.

Figure 4:
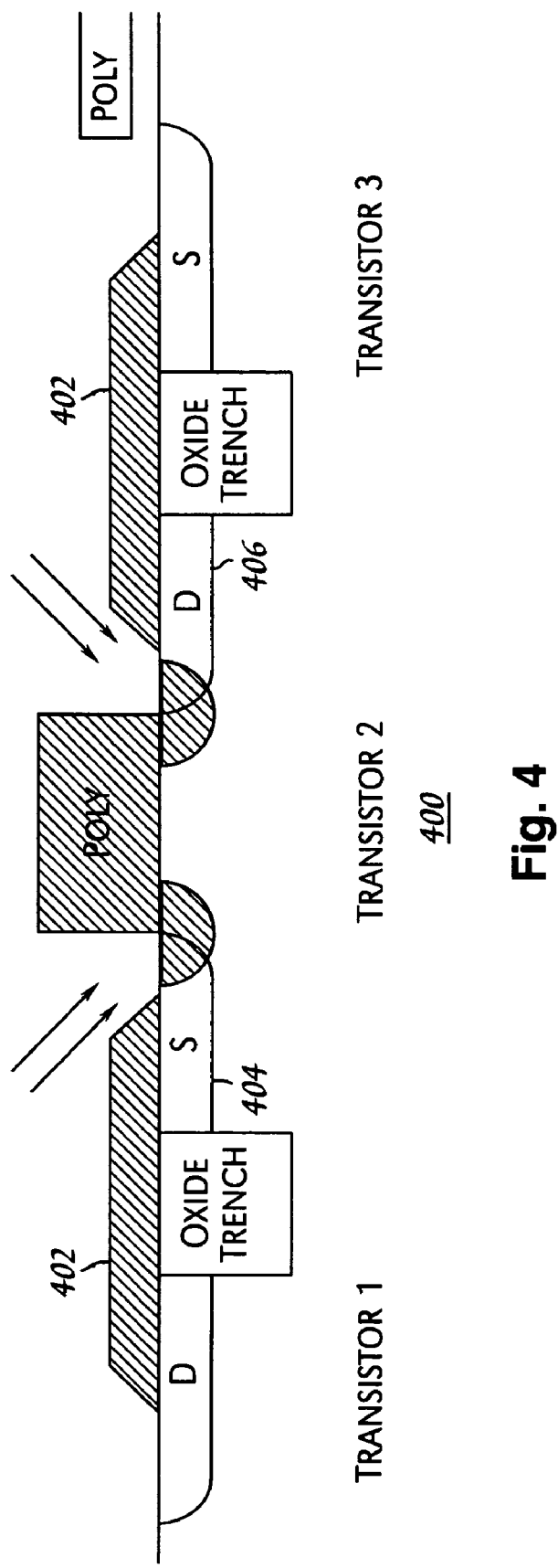
FIG. 4 is a diagram illustrating a semiconductor device after a halo implant in accordance with the present invention.

FIG. 4 is a diagram illustrating a semiconductor device 400 after a halo implant in accordance with the present invention. As is shown, the photoresist mask 402 is a smaller height (0.1 µm to 0.2 µm) than in the conventional process, which allows for more of the source and drain regions 404 and 406 respectively to be masked by the photoresist 402.

Accordingly, in a system and method in accordance with the present invention, a photoresist that is capable of thinner profile, i.e., a DUV photoresist is utilized. This will allow one to lower the photoresist thickness to the proposed 1000 A (in the field) or lower if the process allows. With this photoresist thickness, taking into account other height, the source and drain regions can be opened only as needed. At a 45° angle, the implant can be delivered to all transistors in the circuit in the targeted area as well as getting only a large amount of the dose (up to ¾ of the dose) to the transistor edge which sits on the trench edge. This will also minimize the counter doping of the source drain with the opposite species as is required by the definition of the halo process.

In the smaller geometries of 0.18 um technologies and lower, the gate height will actually work to advantage and help reduce unwanted counter doping of the source and drain region. In this way the counter doping can be maintained to an absolute minimum. The final advantage is that with the thinner photoresist, we will enhance our ability to provide the implant to smaller geometries. Accordingly, the process in accordance with the present invention is the improvement in the manufacture-ability as well as enhancing the process capability and device performance and speed.

Although the present invention has been described in accordance with the embodiments shown, one of ordinary skill in the art will readily recognize that there could be variations to the embodiments and those variations would be within the spirit and scope of the present invention. Accordingly, many modifications may be made by one or ordinary skill in the art without departing from the spirit and scope of the appended claims.

What is claimed is:

1. A method for implanting a halo implant in a semiconductor device comprising the steps of:

providing a first photoresist layer of a thickness 0.55 µm or greater over an oxide trench of said semiconductor device;

providing a lightly doped drain implant;

removing said first photoresist layer;

providing a second photoresist layer of a thickness between 0.1 µm to 0.2 µm over said oxide trench and a substantial portion of a source and a drain region; and implanting a halo implant using said second photoresist layer as a mask.

2. The method as recited in claim 1, wherein said halo implant is implanted at a substantially 45 degree angle.

3. The method as recited in claim 1, wherein said second photoresist layer comprises a deep ultraviolet layer.

* * * * *